United States Patent
Kem

(10) Patent No.: US 6,985,094 B2
(45) Date of Patent: Jan. 10, 2006

(54) METHOD FOR CODING A DATA STREAM

(75) Inventor: Alois Kem, Villingen-Schwenningen (DE)

(73) Assignee: Thomson Licensing, S.A., Boulogne-Billancourt (FR)

( * ) Notice: Subject to any disclaimer, the term of this patent is extended or adjusted under 35 U.S.C. 154(b) by 0 days.

(21) Appl. No.: 10/499,637

(22) PCT Filed: Dec. 9, 2002

(86) PCT No.: PCT/EP02/13902

§ 371 (c)(1),
(2), (4) Date: Jun. 21, 2004

(87) PCT Pub. No.: WO03/054877

PCT Pub. Date: Jul. 3, 2003

(65) Prior Publication Data

US 2005/0097426 A1    May 5, 2005

(30) Foreign Application Priority Data

Dec. 21, 2001  (DE) ............................... 101 63 556

(51) Int. Cl.
*H03M 5/00* (2006.01)
*H03M 13/00* (2006.01)
*H04B 14/04* (2006.01)

(52) U.S. Cl. ............................. 341/58; 341/59; 341/73; 375/253; 714/725

(58) Field of Classification Search ................ 341/58, 341/59, 73; 714/752, 755; 375/253, 261
See application file for complete search history.

(56) References Cited

U.S. PATENT DOCUMENTS

| 4,520,346 A | * | 5/1985 | Shimada ....................... 341/58 |
| 4,728,929 A | * | 3/1988 | Tanaka ......................... 341/73 |
| 4,963,868 A | * | 10/1990 | Takayama et al. ............ 341/72 |
| 5,196,848 A | * | 3/1993 | Sakazaki ...................... 341/58 |
| 5,469,162 A | * | 11/1995 | Chaki et al. .................. 341/58 |

(Continued)

FOREIGN PATENT DOCUMENTS

EP        660325        6/1995

(Continued)

OTHER PUBLICATIONS

Copy of Search Report Dated Jul. 30, 2003.

*Primary Examiner*—Lam T. Mai
(74) *Attorney, Agent, or Firm*—Joseph S. Tripoli; Joseph J. Laks; Joseph J. Opalach

(57) ABSTRACT

The present invention relates to a method for coding a data stream, in which the digital sum value of the coded data stream should be close to zero and two alternative code words can be used for the coding at least for some of the possible data values. It is the object of the invention to propose a method for coding a data stream which provides for simple coding of the data stream while at the same time ensuring a digital sum value close to zero. According to the invention, the object is achieved by a method in which the digital sum value of the coded data stream is determined, this value is compared with a first or a second boundary value in dependence on the polarity of the coded data stream and a received data value is coded by a first or a second code word belonging to the respective boundary value in dependence on the result of the comparison.

12 Claims, 2 Drawing Sheets

U.S. PATENT DOCUMENTS 5,508,701 A * 4/1996 Nose et al. .................... 341/58
5,917,857 A   6/1999 Tanaka et al.
6,079,041 A   6/2000 Kunisa et al.
6,229,459 B1 * 5/2001 Noda .......................... 341/59
6,531,968 B2 * 3/2003 Ahn et al. ..................... 341/59

FOREIGN PATENT DOCUMENTS

EP          718843        6/1996

* cited by examiner

METHOD FOR CODING A DATA STREAM

This application claims the benefit, under 35 U.S.C. § 365 of International Application PCT/EP02/13902, filed Dec. 9, 2002, which was published in accordance with PCT Article 21(2) on Jul. 3, 2003 in English and which claims the benefit of German patent application No. 10163556.7, filed Dec. 21, 2001.

The present invention relates to a method for coding a data stream, where the digital sum value of the coded data stream should be close to zero and two alternative code words can be used for the coding at least for some of the possible data values, and a device which uses the method for coding a data stream.

Such methods are used, for example, for coding data streams which are to be stored on optical storage media.

Known optical storage media for which such a method is used are, among others, the digital versatile disk (DVD) which is used, for example, for videos, music or computer data, or the Super-Audio CD (SACD), which is used especially for items of music and represents a further development of the known compact disk (CD).

Both for the DVD and for the SACD, and also for other optical storage media, a channel modulation scheme, which represents a modification of the 8/14 channel modulation scheme (8 to 14 modulation, EFM) known from the CD, is used for the coding of the data streams. The modified channel modulation scheme is known as EFM+ and converts 8-bit data values directly into 16-bit code words. For coding the data stream, the 16-bit code words are selected from an EFM+conversion table. The 8-bit data values can assume 256 different values. In addition, there are four possible run length states. Run length is understood to be the number of successive logical zeros between two logical ones. For each combination of data value and run length state, the conversion table contains a 16-bit EFM+code word and the run length state for the next data value to be coded.

The coded data stream is provided at regular intervals with 32-bit synchronization code words (SYNC codes), which are used for timing during the decoding of the coded data stream. There are eight different categories of synchronization code words, and it is possible to select from a primary and a secondary synchronization code word in each category. The coded data stream from one SYNC code to the next SYNC code is called a synchronization frame or SYNC frame.

To ensure reliable tracking and reliable detection of the data signal during the reading-out of the optical storage medium, it is of importance to suppress low-frequency components in the coded data stream. For this purpose, the absolute value of the digital sum value (DSV), i.e. the number of logical ones minus the number of logical zeros, of the coded data stream is minimized, that is to say kept close to zero. This is made possible by the EFM+ conversion table including, apart from a main table, a substitute table which provides an alternative code word at least for some of the combinations of data value and run length state. Taking into consideration the run length limitation of 2 channel bits minimum and 10 channel bits maximum (RLL (2, 10)), 351 code words are basically available for run length coding. For historical reasons, 7 of these code words are not used, leaving 344 available code words. Of these, 256 are needed for the main table so that 88 can be used for the substitute table. The substitute table is utilized for coding the 88 lowest data values. To code these 88 data values, the code word from the main table or from the substitute table can be used depending on which one of the code words leads to a lower absolute value of the digital sum value.

If the data values to be coded are within the range from 88 to 255 and if the current run length state is 1 or 4, then the code word belonging to the run length state 1 or 4 can be optionally used for the coding in each case. Thus, the digital sum value can also be influenced in this range of the data values. However, attention must be paid to the fact that the run length limitation is adhered to. It may be necessary to select a code word for the coding which increases the absolute value of the digital sum value but makes it possible to adhere to the run length limitation. For the data values in the range from 88 to 255 which are in the run length state 2 or 3, only one code word is available for the coding in each case.

In summary, the following possibilities for minimizing the absolute value of the digital sum value exist:
A) Selection of the SYNC code between primary and secondary SYNC code.
B) Selection of the code word from the main table or the substitute table for the data values in the range from 0 to 87 for all run length states.
C) Selection of the code word from the code words for the run length states 1 or 4 for data values in the range from 88 to 255 if the current run length state is 1 or 4.

A known method for coding a data stream on the basis of the EFM+ channel modulation scheme consists in generating two coded data streams. The first data stream begins with the primary SYNC code and the second data stream begins with the secondary SYNC code of the same category. The two data streams have different digital sum values since the bit sequences of the primary SYNC code and of the secondary SYNC code differ from one another.

In the abovementioned cases B) and C), there are in each case two possibilities for coding a data value. For this reason, the digital sum value is first calculated for both coded data streams up to the point at which it is necessary to select from two possible code words. The data stream with the lower absolute value of the digital sum value is selected and copied into the second data stream, i.e. it replaces the second data stream or, respectively, the current SYNC frame of the second data stream. Following this, the first possible code word is appended to the first data stream and the second possible code word is appended to the second data stream and the coding is continued. This is repeated whenever case B) or C) occurs.

Whereas case B) always occurs at the same point in both coded data streams, it may happen that case C) occurs only in one of the coded data streams. In this case, a procedure consisting of three steps must be performed:
1. Comparing the absolute value of the digital sum value of both data streams.
2. If the absolute value of the digital sum value of the coded data stream in which case C) occurs is smaller than that of the other coded data stream, the coded data stream affected is selected and copied into the other coded data stream. To each of the two coded data streams, one of the two possible code words is appended.
3. If the absolute value of the digital sum value of the coded data stream in which case C) occurs is greater than that of the other coded data stream, the occurrence of case C) is ignored and the code word belonging to the current run length state is used for the coding of both coded data streams.

For case A), the method provides that the digital sum values of both coded data streams are compared with one another at the end of each SYNC frame. The coded data stream having the digital sum value with the lower absolute value is selected and duplicated into the other data stream. Following this, the selection between primary and secondary SYNC code is continued in the next SYNC frame.

The known method has the disadvantage that, during the coding of the data stream, two coded data streams must be permanently generated and their digital sum values must be repeatedly calculated. This causes considerable complexity for the coding and, associated with this, high costs.

It is, therefore, an object of the invention to propose a method for coding a data stream which avoids said disadvantages and provides for simple coding of the data stream whilst at the same time ensuring a digital sum value close to zero.

According to the invention, the object is achieved by a method which has the following steps:

receiving a data value of the data stream to be coded,
determining the polarity of the data stream already coded,
determining the digital sum value of the data stream already coded,
comparing the digital sum value with a first or second boundary value in dependence on the polarity of the data stream already coded,
coding of the data value to be coded by a first or a second code word, belonging to the respective boundary value, in dependence on the result of the comparison, and
appending the coded data value to the data stream already coded.

The method has the advantage that only a single coded data stream needs to be generated, the digital sum value of which and the polarity of which are determined. By polarity is meant whether the last channel bit of the coded data stream is a logical zero or a logical one. The code word to be used for the coding is then only selected on the basis of the comparison of the digital sum value with a boundary value depending on the polarity.

Depending on whether the digital sum value is above or below the boundary value, the first or the second possible code word is used for the coding. This considerably reduces the coding complexity necessary for the coding.

The first and the second boundary value are advantageously specific to the data value to be coded in each case. This makes it possible to optimally adapt the boundary values to the respective data values which ensures minimization of the absolute value of the digital sum value.

According to the invention, the coded data stream is provided at regular intervals with synchronization code words which are determined in the following manner:

determining the polarity of the data stream already coded,
determining the digital sum value of the data stream already coded,
comparing the digital sum value with a first or a second boundary value in dependence on the polarity of the data stream already coded,
selecting a first or a second synchronization code word, belonging to the respective boundary value, in dependence on the result of the comparison, and
appending the synchronization code word to the data stream already coded.

The method allows the coded data stream to be provided with in each case one of two possible synchronization code words of a category without having to generate two coded data streams and to compare their digital sum values with one another. The synchronization code words provide for simple timing during the decoding of the coded data stream.

The boundary values, the code words and synchronization code words are advantageously stored in tables. This makes it possible to determine the required boundary values, code words and synchronization code words rapidly and in a simple manner. The boundary values, the code words and the synchronization code words can be stored in separate tables in each case or in a common table.

According to the invention, the signed change values of the digital sum value, caused in each case by the code words and the synchronization code words, are also stored in one or more of the tables. It is appropriate to store the change values in the same table as the associated boundary values but they can also be located in the table with code words, a separate table or in a common table. The change values can be positive, negative or also zero and specify the value by which the digital sum value changes if the respective code word is appended to the data stream already coded. The signs of the change values are also specified in the table. Due to the fact that the change values are available together with the sign, it is sufficient to add the associated change value to the digital sum value already determined for calculating the digital sum value after the coded data value has been appended. This makes it easy to calculate the digital sum value.

Advantageously, one of the code words belonging to a boundary value has a smaller change value than the other code word. This must take into consideration the sign of the change value so that, for example, a change value of −4 is smaller than a change value of +2. Thus, it is not the absolute value of the change value which is considered. As a rule, one code word will supply a negative change value and the other code word a positive change value. This ensures that the digital sum value can be both reduced and increased so that the absolute value of the digital sum value can be reduced in every case. In the individual case, both code words can have a positive change value or, respectively, a negative change value and then at least the absolute value of the change values differs. In such a case, it may not be possible to reduce the absolute value of the digital sum value but its increase can be minimized.

According to the invention, the digital sum value is only compared with the first or the second boundary value if the absolute value of the digital sum value is less than or equal to a threshold value. In this manner, the comparison with the boundary values can be restricted to a range of values of the digital sum value in which such a comparison is appropriate at all. In particular, this is the case if the digital sum value is close to zero. This further reduces the coding complexity. In the case of the coding of a data stream for storage on a DVD, an appropriate threshold value is, for example, ten.

According to the invention, the code word with the smaller change value is used for coding the data value when the digital sum value of the coded data stream is greater than the threshold value, and the code word with the greater change value is used when the digital sum value of the coded data stream is smaller than the negative threshold value. This ensures that the absolute value of the digital sum value is always reduced to a maximum extent by appending the coded data value or, respectively, increased to a minimum extent when the absolute value of the digital sum value of the data stream already coded is greater than the threshold value.

The coded data stream is advantageously always in one of a number of possible states, the respective state being determined by the last code word appended and being redetermined by a further code word being appended. The states are determined by the current run length of the coded data stream. However, it is also possible to think of states which are specified by other parameters of the coded data stream. Using a number of states makes it possible to ensure, apart from minimizing the absolute value of the digital sum value, that, at the same time, a run length limitation is adhered to in the coding of the data stream.

Specific first and second boundary values and associated first and second code words are advantageously provided in each case for at least some of the combinations of possible data values and states. Since only a limited number of possible code words is available for coding the possible data values, it may not be possible to provide two alternative code words for every data value and every state. If, however, alternative code words are provided at least for some of the combinations of data value and state, it is still possible to minimize the absolute value of the digital sum value of the coded data stream and to ensure that a run length limitation is adhered to.

According to the invention, information about the influence of the possible code words on the run length of the coded data stream are stored in one of the tables for at least some of the data values and it is checked by means of the stored information whether the coding of a data value with the code word determined by a method according to the invention would cause a violation of a run length limitation, and the alternative code word is used for the coding if such a violation were to be the case.

Advantageously, a method according to the invention for coding a data stream is used by a device for reading from and/or writing to optical recording media. This has the advantage that the coding of the data stream necessary for writing the optical recording medium can be implemented with little coding complexity.

Naturally, combinations of advantageous features are also within the range of validity of the invention.

In the text which follows, the invention will be explained by means of FIGS. 1 and 2 to provide better understanding. Identical reference symbols designate identical elements. In the figures:

DESCRIPTION OF DRAWING

FIG. 1 diagrammatically shows a method for coding a data stream (DS) according to the prior art. As has already been mentioned before, two coded data streams are generated after the primary and the secondary SYNC code have been selected. Since both coded data streams are generated in the same manner and the coded data stream which has the lower absolute value of the digital sum value is only selected after the end of a SYNC frame, the representation is restricted to generating a single coded data stream (CS) after completed selection of the SYNC code.

A data value (Byte) is received from the data stream (DS) to be coded. If the data value (Byte) is within the range from 0 to 87, code words (CW_M, CW_S) from a main table (Main) and a substitute table (Subs) are available for the coding. Using these code words (CW_M, CW_S), two coded data streams (CS_M, CS_S) are generated, the code word (CW_M) from the main table (Main) being used for the first data stream (CS_M) and the code word (CW_S) from the substitute table (Subs) being used for the second data stream (CS_S) for the coding. Following this, the absolute value (|DSV|) of the digital sum value (DSV) of the two coded data streams (CS_M, CS_S) is calculated and compared. The code word (CW_M, CW_S) providing the lower absolute value (|DSV|) of the digital sum value (DSV) is finally used for the coding. This is done in such a manner that the coded data stream (CS_M, CS_S) with the lower absolute value (|DSV|) of the digital sum value (DSV) is copied into the other data stream (CS_M, CS_S), thus providing two identical coded data streams (CS).

If the data value (Byte) to be coded is greater than 87, only values (CW1, CW2, CW3, CW4) from the main table (Main) are available for the coding. In this case, the run length state (State) of the data stream (CS) already coded must be taken into consideration for the coding. If the run length state (State) is 2 or 3, exactly one code word (CW2, CW3) belonging to the data value (Byte) and to the run length state (State) is in each case available for the coding. Using this code word (CW2, CW3), the data value (Byte) is coded and appended to the data stream (CS) already coded. If, in contrast, the coded data stream (CS) is in run length state (State) 1 or 4, the code words (CW1, CW4) belonging to the data value (Byte) and the run length states (State) 1 or 4 can be used in each case for the coding. Two coded data streams (CS1, CS4) are, therefore, generated, the code word (CW1) allocated to the run length state (State) 1 being used for the first coded data stream (CS1) and the code word (CW4) allocated to the run length state (State) 4 being used for the second coded data stream (CS4). Following this, the absolute value (|DSV|) of the digital sum value (DSV) is calculated for both data streams (CS1, CS4) and compared with one another. Finally, the code word (CW1, CW4) which supplies the lower absolute value (|DSV|) of the digital sum value (DSV) is used for the coding. In this case, too, this is done in such a manner that the coded data stream (CS1, CS4) having the lower absolute value (|DSV|) of the digital sum value (DSV) is copied into the other data stream (CS1, CS4), thus providing two identical coded data streams (CS).

Figure 1:
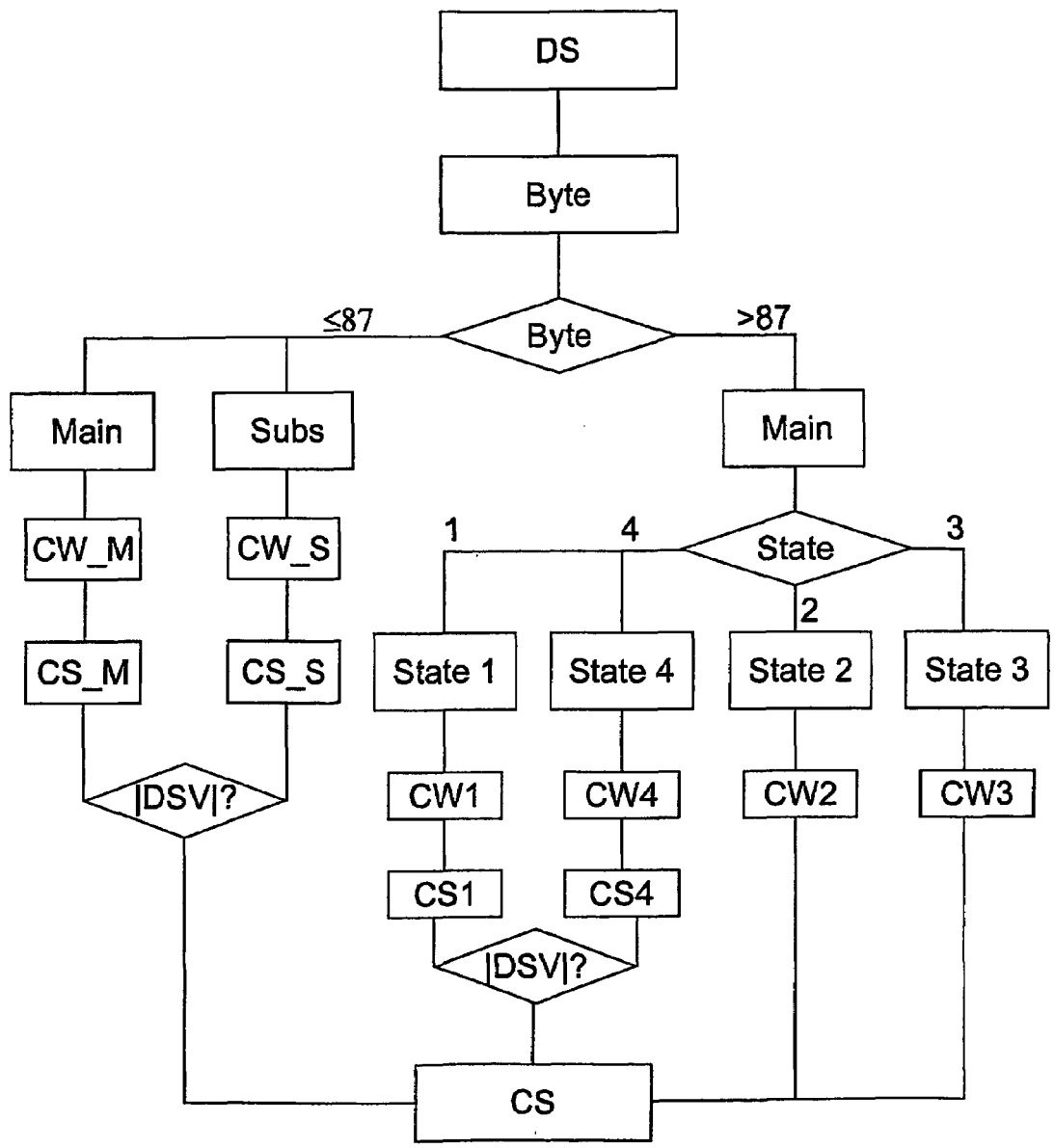
FIG. 1: shows a method for coding a data stream according to the prior art.
Figure 2:
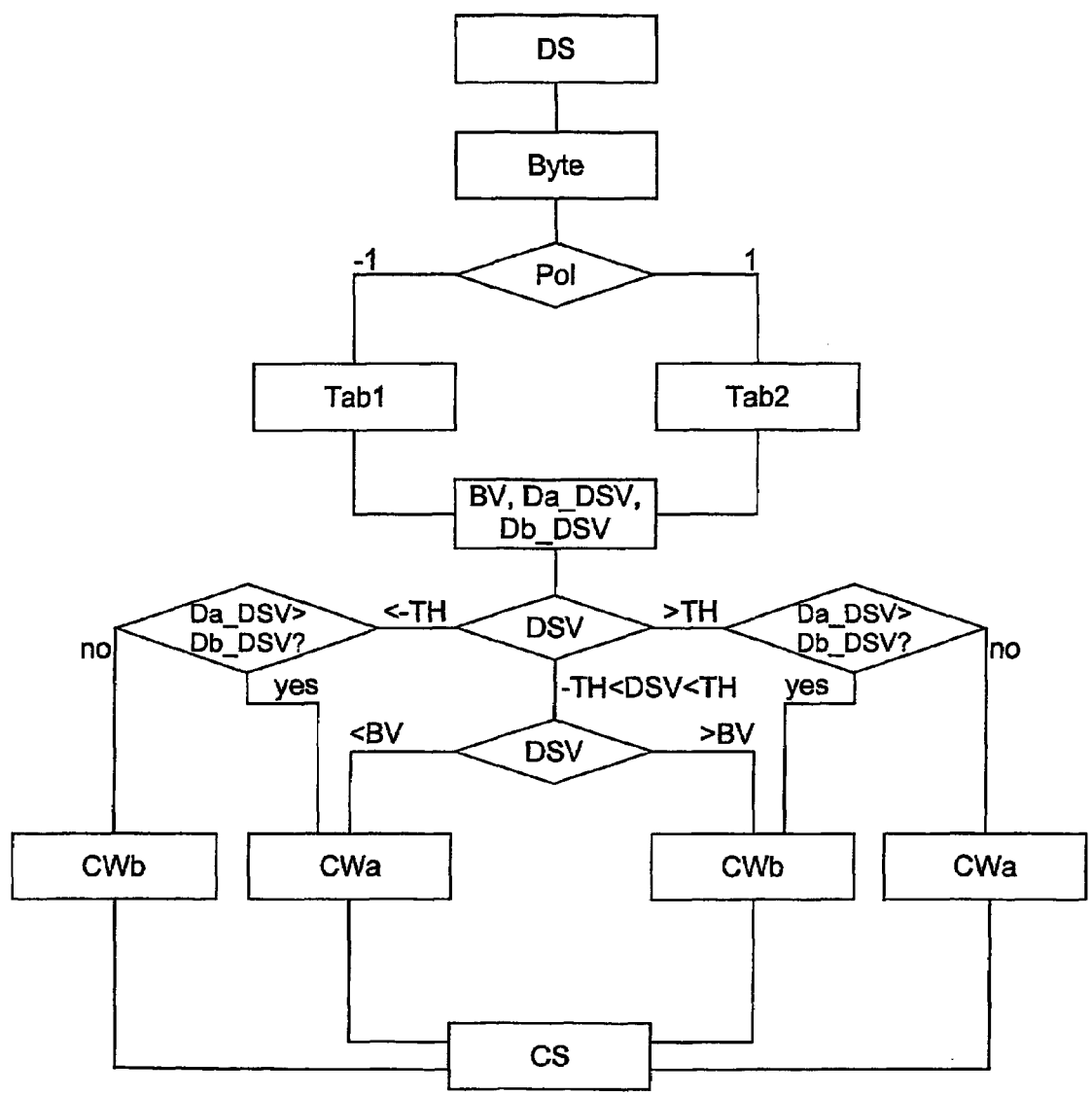
FIG. 2: shows a method according to the invention for coding a data stream.

FIG. 2 shows an exemplary embodiment of a method according to the invention for coding a data stream (DS).

Once a data value (Byte) has been received from the data stream (DS) to be coded, the polarity (Pol) of the data stream (CS) already coded is determined. If the last bit of the coded data stream (CS) is a logical zero, the polarity (Pol) is −1, if the last bit is a logical one, the polarity (Pol) is 1. Depending on the polarity (Pol) determined, a first table (Tab1) or a second table (Tab2) is used for the coding. In the exemplary embodiment, three values (Da_DSV, Db_DSV, BV) are specified for every combination of data value (Byte) and run length state (State) in which it is possible to choose between two code words (CWa, CWb) for the coding. The first value (Da_DSV) describes the change value of the digital sum value (DSV) when using the first code word (CWa) for the coding, the second (Db_DSV) describes the change value of the digital sum value (DSV) when using the second code word (CWb) for coding and the third value (BV) represents a boundary value with which the current digital sum value (DSV) of the coded data stream (CS) is compared in order to decide which of the code words (CWa, CWb) is to be used for the coding. The first and the second value (Da_DSV, Db_DSV) are signed. First, the digital sum value (DSV) is then compared with a threshold value (TH). If the digital sum value (DSV) is smaller than the negative threshold value (−TH), the code word (CWa, CWb) having the greater change value (Da_DSV, Db_DSV) is used for the coding. If the digital sum value (DSV) is greater than the threshold value (TH), the code word (CWa, CWb) having the smaller change value (Da_DSV, Db_DSV) is used for the coding. If the digital sum value (DSV) is between the negative threshold value (−TH) and the threshold value (TH), the digital sum value (DSV) is compared with the boundary value (BV). If the digital sum value (DSV) is below the boundary value (BV), the first code word (Cwa) is used for the coding. If the digital sum value (DSV) is above the boundary value (BV), the second code word (CWb) is used for the coding. Finally, the code word (CWa, CWb) unambiguously determined in this manner is read out of the main table (Main) or the substitute table (Subs) and appended to the data stream (CS) already coded. FIG. 2 does not show the case where only one possible code word is available for a particular combination of data value (Byte) and state (State). In principle, it is possible to omit the determination of the polarity (Pol) and the comparison of the digital sum value (DSV) with the threshold value (TH) or, respectively, with the boundary value (BV) in this case.

The SYNC code is selected from the primary and secondary SYNC code of a category in the same manner and will not be explained in greater detail here.

What is claimed is:

1. A method for coding a data stream, in which the digital sum value of the coded data stream should be close to zero and two alternative code words can be used for the coding at least for some of the possible data values (Bytes) comprising:
   receiving a data value of the data stream,
   determining the polarity of the coded data stream,
   determining the digital sum value of the coded data stream,
   comparing the digital sum value with a first or second boundary value in dependence on the polarity of the coded data stream,
   coding of the received data value by a first or a second code word, belonging to the respective boundary value, in dependence on the result of the comparison, and
   appending the coded data value to the coded data stream.

2. The method as claimed in claim 1, wherein the first and the second boundary value and the respective associated first and second code word are specific to the data value to be coded.

3. The method as claimed in claim 1, wherein the coded data stream is provided at regular intervals with synchronization code words and further comprising:
   determining the polarity of the coded data stream,
   determining the digital sum value of the coded data stream,
   comparing the digital sum value with a first or a second boundary value in dependence on the polarity of the coded data stream,
   selecting a first or a second synchronization code word, belonging to the respective boundary value, in dependence on the result of the comparison, and
   appending the synchronization code word to the coded data stream.

4. The method as claimed in claim 3, wherein the boundary values, the code words and the synchronization code words are stored in tables.

5. The method as claimed in claim 4, wherein the signed change values, in each case caused by the code words and the synchronization code words, of the digital sum value are stored in one of the tables.

6. The method as claimed in claim 1, wherein one of the code words belonging to a boundary value has a smaller change value, taking into consideration the sign, than the other code word.

7. The method as claimed in claim 1, wherein the digital sum value is only compared with the first or the second boundary value if the absolute value of the digital sum value is less than or equal to a threshold value.

8. The method as claimed in claim 7, wherein the code word having the smaller change value is used for the coding if the digital sum value of the coded data stream is greater than the threshold value, and that the code word having the greater change value is used if the digital sum value of the coded data stream is smaller than the negative threshold value.

9. The method as claimed in claim 1, wherein the coded data stream is in one of a number of possible states, the respective state being determined by the last code word appended and being redefined by appending another code word.

10. The method as claimed in claim 9, wherein there are in each case specific first and second boundary values and associated first and second code words for at least some of the possible combinations of data value and state.

11. The method as claimed in claim 1, wherein information about the influence of the possible code words on the run length of the coded data stream is stored in one of the tables for at least some of the data values and it is checked by means of the stored information whether the coding of a data value with the code word determined by a method according to claim 1 causes a violation of a run length limitation, and the alternative code word is used for the coding if this is the case.

12. A device for reading from and/or writing to optical recording media, wherein it uses a method according to claim 1.

* * * * *

UNITED STATES PATENT AND TRADEMARK OFFICE
CERTIFICATE OF CORRECTION

PATENT NO.         : 6,985,094 B2
APPLICATION NO. : 10/499637
DATED                  : January 10, 2006
INVENTOR(S)         : Alois Kern It is certified that error appears in the above-identified patent and that said Letters Patent is hereby corrected as shown below:

Title Page;
Under INVENTOR "Alois Kem" should be listed as --Alois Kern--. This was mistake incurred by the United States Patent and Trademark Office.

Signed and Sealed this

Twelfth Day of September, 2006

JON W. DUDAS
*Director of the United States Patent and Trademark Office*